DEVICES UTILIZING LITHIUM META-GALLATE

Filed Dec. 19, 1963

2 Sheets-Sheet 1

INVENTOR
J. P. REMEIKA
BY George S. Indig
ATTORNEY

United States Patent Office 3,283,164
Patented Nov. 1, 1966

3,283,164
DEVICES UTILIZING LITHIUM META-GALLATE

Joseph P. Remeika, Warren Township, Somerset County, N.J., assignor to Bell Telephone Laboratories, Incorporated, New York, N.Y., a corporation of New York Filed Dec. 19, 1963, Ser. No. 331,871
7 Claims. (Cl. 250—225)

This invention relates to device elements utilizing lithium meta-gallate ($LiGaO_2$) as the active material, and to devices utilizing such elements. Such devices depend for their operation upon the piezoelectric and related properties, such as electro-optic effect, etc., of this material.

It is unnecessary to discuss at any length the role played by piezoelectric devices in modern technology. Quartz filters and resonators have played an important role for decades. The literature abounds with references to other piezoelectric devices such as hydrophones, sonar devices, delay lines, transducers, and other ultrasonic generators and detectors. Probably quartz is the best known piezoelectric material. Its popularity, in large part, is due to its physical and chemical stability. It is generally unreactive with atmospheric components, is stable over long use and withstands relatively high physical strain. The organic materials, many of which were developed during World War II in expectation of a quartz shortage, although possessed of significantly larger coupling coefficients, dissolve in water, are chemically unstable and are otherwise unsuitable for many uses to which quartz is put.

For many uses, a need exists for a piezoelectric material having a higher coupling coefficient than quartz and otherwise evidencing the excellent physical and chemical properties of this material. In the past, it has been possible to meet some of these needs by means of hermetically sealed organic crystals. Housings are so designed that interaction with atmospheric components is avoided, and so that mechanical coupling is permitted, usually by means of rubber or other yieldable housing sections. In most uses, however, it has been necessary to continue using quartz despite its inefficient energy conversion.

In accordance with this invention, it has been discovered that lithium metal-gallate combines many of the best piezoelectric attributes of the two classes of prior art materials. This material does not react with normal atmospheric components, does not dissolve in water, and is otherwise physically and chemically stable. Not yet completely investigated, $LiGaO_2$ has thus far yielded a piezoelectric coupling coefficient of 25 percent, which compares favorably with the maximum coefficient of 0.095 for quartz. The dielectirc constant for the material is well below 20, one measurement indicating a value of about 10. Hardness lies between that of quartz and sapphire. An elastic Q value of 75,000 has been measured. Otherwise, the material is indicated as having device applications based on its electro-optic activity and its ability to generate second harmonics at frequencies in and about the visible spectrum.

Workers in the art are aware of several other inorganic piezoelectric materials discovered during the past few years, many of which have excellent device capabilities. These materials, however, have not yet found widespread use due to the difficulty of preparation. Such persons will recognize the significance of the fact that $LiGaO_2$ is congruently melting (with a melt point of about 1600 degrees centigrade), so permitting melt growth, as by pulling, in large sections at expedient rates. Lithium meta-gallate may also be prepared by spontaneous or seed nucleation from a flux. While it is expected that commercial manufacture will make use of melt growing, the second procedure has been useful in the introduction of small amounts (about 1 percent or below) of a variety of solutes. Studies relating to various of the properties are discussed herein. Both growth techniques are discussed in some detail.

While many of the competing inorganic piezoelectric materials reported recently are semiconducting in their piezoelectric state, with the known attendant advantages and disadvantages, lithium meta-gallate is an insulator with a room temperature resistivity of the order of $10^{14}$ ohm-centimeters or greater. Studies conducted thus far reveal no ferroelectricity over a range of from 450 degrees centigrade down to liquid nitrogen. This, coupled with the material's low dielectric constant, enhances its appeal for use in high frequency transducers.

Other interesting properties include a brilliant, long-lived green phosphorescence after exposure to long-wave ultraviolet excitation for a sample prepared under specific conditions set forth herein. The optical qualities of the material and its ability to accept small quantities of active ions suggest its use as a maser or laser host. The piezoelectric activity, as well as certain other propertes set forth, suggests the possibility of the internal modulation of the coherent emission from such a device. Other device uses may be suggested by the fact that lithium meta-gallate belongs to a crystal class capable of manifesting pyroelectricity. Lithium meta-gallate has been determined to have an orthorhombic morphology. The space group has been determined to be Pn2al.

A discussion of various of the device uses of lithium meta-gallate is expedited by reference to the drawings, in which.

Figure 1:
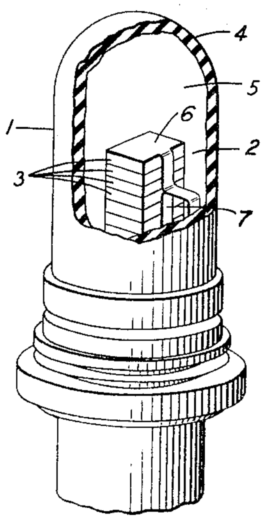
FIG. 1 is a perspective view, partly in section, of a hydrophone utilizing a stacked $LiGaO_2$ crystal array as the active element.

Referring again to FIG. 1, the device depicted is a typical hydrophone 1 employing a stack 2 of thin, parrallel-connected lithium meta-gallate plates 3. The purpose of the stacked configuration, parallel connected by means of interleaved foil electrodes, not shown, is to obtain higher capacitance or lower impedance, unobtainable with a single thick crystalline block of given dimensions. Cover 4 of housing 1 is made of rubber or other flexible material so arranged as to yield under the influence of applied hydrostatic pressure. Coupling with crystal stack 2 is made through an oil or other fluid medium 5 which fills the entire interstitial volume between stack 2 and cover 4. ll of plates 3 are oriented in the same manner. Electrode contact is made via electrodes 6 and 7, so arranged as to read off or produce a field.

The hydrophone of FIG. 1 is of course, suitable for use as a transmitter as well as a receiver. As a transmitter, field is produced across the crystal stack by means of electrodes 6 and 7, and the physical vibration so produced is transferred through oil medium 5 and rubber cover 4 into the surrounding medium.

Figure 2:
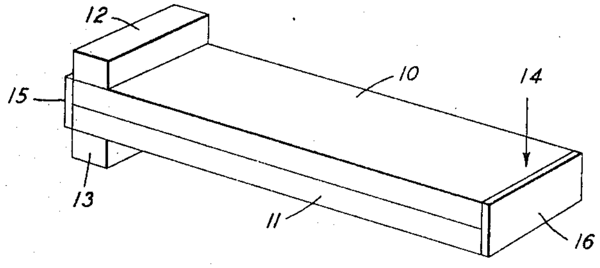
FIG. 2 is a perspective view of a cantilever mounted bender "bimorph" element also utilizing the piezoelectric material of this invention.

In FIG. 2 there is shown a cantilever mounted bender "bimorph" such as may find use in a crystal pick-up phonograph arm. The element shown consists of lithium meta-gallate plates 10 and 11, oriented in opposite directions so that compression on element 10 and tension on element 11 results in an electrical field of a given direction. Plates 10 and 11 are shown rigidly clamped between soft rubber or plastic pads 12 and 13. Application of force at point 14, which may result from the back-and-forth movement of a stylus produced by undulations in the grooves of a rotating phonograph record, produces an A.–C. voltage developed between electrodes 15 and 16. Leads, not shown, attached to the said electrodes 15 and 16 in turn serve as input leads to an audio amplifier, also not shown.

Figure 3:
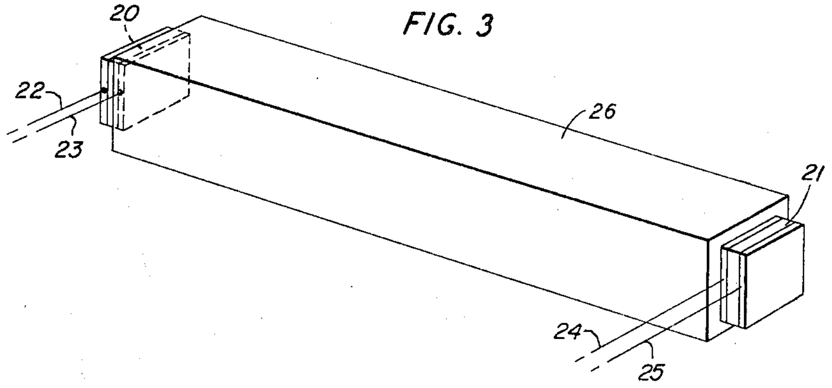
FIG. 3 is a perspective vew of an ultrasonic delay line utilizing elements of the inventive material.

The device of FIG. 3 is an ultrasonic delay line. The device consists of lithium meta-gallate elements 20 and 21. Each of the elements 20 and 21 has electrodes deposited or otherwise affixed to flat surfaces, the said electrodes in turn being electrically connected with wire leads 22 and 23 for element 20, and 24 and 25 for element 21. Elements 20 and 21 are cemented to vitreous silica delay element 26, which serves to transmit physical vibrations from one of the piezoelectric elements to the other. In operation, a signal impressed across, for example, leads 22 and 23 of element 20 results in a field produced across that element, so producing vibration in the crystal. This vibration, of a frequency corresponding with the signal, is transmitted through a delay element 26 and finally results in a similar vibration being produced in piezoelectric element 21. The resulting signal produced across wire leads 24 and 25 is of the same frequency as that introduced across leads 22 and 23. A typical device of this class may have a length of the order of five inches and a square cross-section of the order of three-quarters of an inch on a side.

Figure 4:
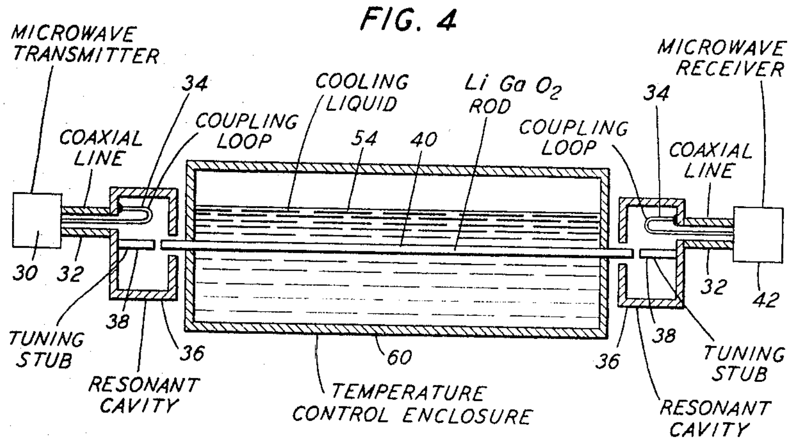
FIG. 4 is a diagrammatic view of a microwave ultrasonic delay line utlizing $LiGaO_2$ as the active material.

In FIG. 4 a microwave frequency transmitter 30 is connected by a short length of coaxial line 32 to coupling loop 34 of the adjacent metallic resonant cavity 36. The left end of an elongated $LiGaO_2$ rod 40 protrudes a short distance into the cavity 36, as shown, and a metallic tuning stub 38 attached to the left wall of the cavity 36 is preferably positioned, as shown, so as to cause a concentration of the lines of electric force, generated in the cavity 36, in the vincinity of the end of the $LiGaO_2$ rod 40. The axis of tuning stub 38 is situated along the extension of the longitudinal axis of the $LiGaO_2$ rod 40. Rod 40 is cut from a single crystal of $LiGaO_2$. Stub 38 may be spaced a short distance from the end of rod 40, as shown, or, alternatively, it may be in physical contact with it. Likewise, the opening in the cavity 36 through which rod 40 protrudes may be slightly larger than rod 40, as shown, or, alternatively, it may provide a close, sliding fit with rod 40. Cavity 36 is resonant at the frequency supplied by transmitter 30 and serves to generate ultrasonic waves in rod 40 of the same frequency as that of the electrical energy.

At the right end of rod 40, a second resonant cavity 36 may be coupled to the right end of rod 40 and will respond to the ultrasonic waves on rod 40 by generating microwave electrical energy of corresponding frequency. The cavity 36 is electrically connected through a second coupling loop 34 and a short section of coaxial line 32 to microwave receiver 42.

An enclosure 60 surrounds the $LiGaO_2$ rod 40, except for the small portions extending into the cavity 36 at each end of the rod. Enclosure 60 contains an appropriate cooling liquid 54, selected to establish the desired temperature of rod 40 at which its transmission loss to the ultrasonic waves being transmitted is very small. Rod 40 is preferably completely immersed in the liquid 54.

Three widely used cooling liquids for establishing very low temperatures are liquid nitrogen, liquid hydrogen, and liquid helium. Temperatures readily maintained by these three liquids are, respectively, 77 degrees Kelvin, 20 degrees Kelvin, and 4 degrees Kelvin.

Figure 5:
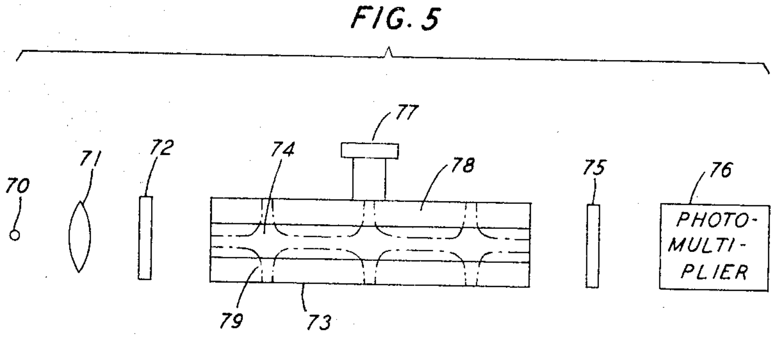
FIG. 5 is a front elevational view, partly in section, of apparatus for modulating a light beam utilizing the electro-optic effect in lithium meta-gallate.

The apparatus of FIG. 5 consists of a laser or other light source 70, collimator 71, if required, polarizer 72, cylindrical cavity 73 containing $LiGaO_2$, rod 74, crossed analyzer 75, and photomultiplier or other detector 76. Cylindrical cavity 73 is fed by an electrical field generator such as a pulsed $x$-band magnetron through inlet 77. Cavity 73 is filled with polystyrene in the annular space 78 surrounding rod 79 and the dimensions are adjusted so that the microwave phase velocity approximates the light velocity when the cavity is excited appropriately. The pattern of an appropriate E field is shown schematically by means of dashed lines 79. In the simple embodiment shown, application of the electric field rotates the plane of polarization of the incoming beam to a position more or less approximating that of the analyzer 75 and, accordingly, is a measure of the degree of rotation of the plane.

The device of FIG. 5 operates as an amplitude modulator and depends on the variation in the intensity of light of a particular polarization plane which is transmitted due to the introduction or variation in birefringence of the active material under the influence of the applied electric field. Since the introduction of birefringence results from the variation in the velocity of light propagation in a particular plane, it is seen that application of the E field necessarily results in a phase shift in such plane. This shift suggests a phase modulation apparatus identical to that shown in FIG. 5, however utilizing a detecting apparatus constituting a means for comparing the exiting wave with a standard.

The subject of electro-optic modulation has been thoroughly treated in the literature (see, for example, "Microwave Modulation of Light by the Electro-Optic Effect," by I. P. Kaminow, Physical Review Letters, volume 6, page 528, 1961).

Figure 6:
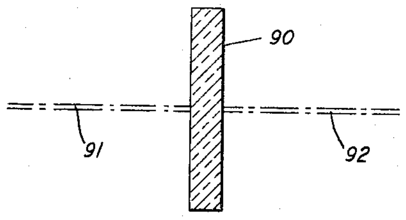
FIG. 6 is a diagrammatic view of an harmonic generating device utilizing a crystal of the material herein.

The apparatus of FIG. 6 comprises $LiGaO_2$, crystal 90, onto which there is focused a light beam 91 of a given wavelength, for example the coherent 6943 Angstrom output of a ruby maser, and from which there emanates a light beam 92, including radiation at twice the frequency of that introduced in 91, for example having a wavelength of 3472 Angstroms. The phenomenon responsible for the operation of the device of FIG. 6 is based on the fact that the response of a piezoelectric material to a high electric field, that is, that produced by electromagnetic radiation, is nonlinear. When a wave of any pure single frequency passes through such a nonlinear medium, the wave shape is distorted. This resulting distorted wave is equivalent to the original wave, with the addition of one or more harmonic waves having two, three, or more times the frequency of the original. For a detailed discussion of this phenomenon, see "Harmonic Generation and Mixing of Calcium Tungstate, Neodymium and Ruby Pulsed Laser Beams in Piezoelectric Crystals," R. C. Miller and A. Savage, Physical Review, volume 128, page 2175, 1962.

*Method of preparation*

Lithium meta-gallate is easily prepared either by melt growth or flux growth, in either instance with or without seeding. Expedient starting materials are lithium carbonate and gallium oxide. Any other materials which will break down under the growth conditions to produce the oxides are suitable.

Various of the properties of $LiGaO_2$ discussed above suggest the introduction of various solute materials. Experimental introduction of such solutes is expeditiously accomplished by flux growth. While ingredient ranges including nutrient to nutrient ratio and over-all nutrient to flux ratio have not been investigated thoroughly, the following optimum and permissible ratios have been determined. Indicated amounts are based on a flux consisting of 2 grams of boron oxide and 25 grams of lead oxide.

| Range | Lithium Carbonate, grams | Gallium Oxide, grams |
|---|---|---|
| Optimum | 2.77 | 7.03 |
| Maximum | 3.69 | 9.37 |
| Minimum | 2.31 | 5.86 |

The values set forth in the table above are not to be construed as limiting, although for the particular flux set forth, significant formation of spinel has been observed above the maximum set forth. All ratios represent the stoichiometric 1:1 ratio of lithium and gallium on a mol basis. Deviation from the 1:1 ratio can be tolerated, although significant deviation can only result in the formation of additional phases. All ratios are based on total solution at 1300 degrees centigrade, with initial nucleation occurring at 1275 degrees centigrade for the optimum flux composition. Crystallization is expeditiously carried out over a cooling rate of about 5 degrees to one-half degree centigrade per hour or lower. Where crystallization is carried to a temperature at which the entire flux is solid, crystals of $LiGaO_2$ are removed by leaching. Since strong acids have the effect of lightly etching the crystals, it is preferable to use acetic rather than nitric acid as a leaching agent to minimize this effect. Materials such as chromium, cobalt, manganese, and nickel in amounts of less than 1 percent by weight have been introduced during flux growth. Solubilities are generally such that about twice the desired quantity is introduced into the flux.

Crystal pulling by the standard Czochralski method has been carried out and has resulted in crystals of good apparent optical properties at pulling rates as high as three inches per hour. Pulling was carried out in air (although a different atmosphere may be indicated where it is desired to closely control a volatile ingredient or additive), utilizing lithium carbonate and gallium oxide as the starting ingredients. It was, of course, necessary to raise the temperature of the ingredients to the melting point of lithium meta-gallate (about 1600 degrees centigrade).

It was in connection with crystal pulling experiments that it was found that crystals grown from a stoichiometric melt in air had a brilliant green phosphorescence after exposure to long wave ultraviolet excitation. It has been determined that the phosphorescence results from crystals which are enriched with respect to gallium above the 1:1 stoichiometric ratio. This enrichment results from the loss of lithium by volatilization from the melt. If it is desired to avoid ths phosphorescence, such may be accomplished by enriching the melt with respect to lithium, the degree of enrichment of course depending upon the total growth period, as well as other apparent factors. For a growth period of about thirty minutes, a 1 percent enrichment by weight was found adequate. For long periods, it may be desirable to periodically add lithium, or, alternatively, to control the atmosphere so as to prevent gallium reduction. In general, it has been found that excess lithium may be tolerated in the melt up to levels of about 4 percent. It has been postulated that the phosphorescence is caused by a trapping mechanism associated with the oxygen vacancies resulting from the presence of $Ga^{+2}$.

The invention has, of necessity, been described in terms of a limited number of illustrative embodiments. The invention resides in the discovery of the piezoelectric and related characteristics of device capability in lithium metagallate. The value of the material is enhanced by the ease with which it can be grown, its low dielectric constant, its exceptional optical properties, its physical and chemical durability, etc. Illustrative device uses have been in terms of piezoelectricity, electrostriction, electrooptic coupling, and harmonic generation. Other uses, such as parametric amplification, are known to those skilled in the art. All such applications are considered to come within the scope of this invention.

What is claimed is:

1. Device comprising at least one element consisting essentially of a body of crystalline material, the composition of which may be represented by the formula $LiGaO_2$, and means for producing an electrical field gradient across at least a portion of the said body.

2. Device of claim 1 in which the said means comprises electrodes.

3. Device of claim 1 in which the said means comprises a cavity adapted to support electromagnetic radiation.

4. Device of claim 1 in which the said body is a single crystal.

5. Device comprising at least one element consisting essentially of a body of crystalline material, the composition of which may be represented by the formula $LiGaO_2$, together with two electrodes so positioned as to include a portion of the said body therebetween.

6. Device consisting essentially of a single crystal of $LiGaO_2$, together with means for irradiating a surface of the said crystal with substantially monochromatic electromagnetic radiation, and means for detecting radiation leaving the said crystal.

7. Device comprising a single crystal consisting essentially of $LiGaO_2$, together with means for applying an alternating electrostatic field across at least a portion of the said crystal, means for irradiating a surface of the said crystal with a beam of plane polarized electromagnetic radiation, and means for detecting a transmitter beam of electromagnetic radiation.

References Cited by the Examiner

UNITED STATES PATENTS

| | | | |
|---|---|---|---|
| 3,090,876 | 5/1963 | Hutson | 252—62.9 |
| 3,091,707 | 5/1963 | Hutson | 252—62.9 |
| 3,093,758 | 6/1963 | Hutson | 252—62.9 |

OTHER REFERENCES

Hoppe: Angewandte Chemie, Jahrg. 71, Juli-Dez. 1959, page 457.

RALPH G. NILSON, *Primary Examiner.*

M. A. LEAVITT, *Assistant Examiner.*